US005602514A

United States Patent [19]
Monk et al.

[11] Patent Number: 5,602,514
[45] Date of Patent: Feb. 11, 1997

[54] QUADRATURE OSCILLATOR HAVING A VARIABLE FREQUENCY

[75] Inventors: Trevor K. Monk, Chepstow, England; Andrew M. Hall, Edinburgh, Scotland

[73] Assignee: SGS-Thomson Microelectronics, Ltd., Buckinghamshire, United Kingdom

[21] Appl. No.: 636,851

[22] Filed: Apr. 23, 1996

Related U.S. Application Data

[63] Continuation of Ser. No. 360,697, filed as PCT/GB94/00892, Apr. 27, 1994, published as WO94/26027, No. 10, 1994, abandoned.

[30] Foreign Application Priority Data

Apr. 30, 1993 [GB] United Kingdom ............. 9308944

[51] Int. Cl.$^6$ .............................. H03B 5/24; H03B 27/00
[52] U.S. Cl. ........................... 331/57; 331/45; 331/74; 331/75; 331/111; 331/143; 331/177 R; 331/DIG. 3; 327/293; 327/295
[58] Field of Search .................... 331/1 A, 34, 45, 331/57, 60, 74, 75, 111, 113 R, 143, 144, 175, 177 R, DIG. 3; 327/170, 254, 255, 293, 295; 326/93, 95

[56] References Cited

U.S. PATENT DOCUMENTS

| | | | |
|---|---|---|---|
| 3,350,659 | 10/1967 | Henn | 331/45 |
| 3,382,455 | 5/1968 | Rapp | 331/DIG. 3 X |
| 4,368,480 | 1/1983 | Senturia | 357/25 |
| 5,399,994 | 3/1995 | Siniscalchi et al. | 331/DIG. 3 X |

FOREIGN PATENT DOCUMENTS

| | | | |
|---|---|---|---|
| 0187572 | 7/1986 | European Pat. Off. | H03K 19/094 |
| 0407082 | 1/1991 | European Pat. Off. | G06F 1/04 |

OTHER PUBLICATIONS

Glasser and Dobberpuhl, "The Design and Analysis of VLSI Circuits," Addison–Wesley Publishing Company, Reading, Massachusetts, 1985, pp. 34–37, 228–229. No Month.

Bennett et al., "Sub–Nanosecond Bipolar LSI," 1st I.E.E. European Solid State Circuits Conference, London, GB, pp. 34–35, 1975. No Month.
IBM Technical Disclosure Bulletin, 32:(12), pp. 149–151. May 1990.
Kumar, U. and S. P. Suri, "A simple digital $2^n$ frequency multiplier," Int. J. Electronics 48:(1), pp. 43–45, 1980. No Month.
McGahee, T., "Pulse–frequency doubler requires no adjustment," Electronics 48:(8), p. 149, 1975, Apr.
Ware, et al, "THPM 14.1: A 200 MHz CMOS Phase–Locked Loop With Dual Phase Detectors," IEEE International Solid–State Circuits Conference, New York, USA, pp. 192–193 and 338, 1989, Feb.

*Primary Examiner*—David Mis
*Attorney, Agent, or Firm*—David V. Carlson; Seed and Berry LLP

[57] ABSTRACT

A quadrature oscillator is provided constructed of NOR gates in the manner of a non-linear circuit which is inherently unstable and which cycles sequentially through four distinct states at a rate determined by the constitution of the NOR gates. The quadrature oscillator includes first and second stages that each include first and second NOR gates. The output of the first NOR gate of the first stage is connected as an input to the second NOR gate of each of the first and second stages. The output of the second NOR gate of the first stage is connected as an input to the first NOR gate of each of the first and second stages. The output of the first NOR gate of the second stage is connected as an input to the first NOR gate of the first stage and the second NOR gate of the second stage. The output of the second NOR gate of the second stage is connected as and input to the second NOR gate of the first stage and the first NOR gate of the second stage. Each of the NOR gates includes first and second input transistors that each have a control node for receiving an input signal and a controllable path between an output node and a reference voltage, a diode-connected transistor connected between the output node and the reference voltage, and a current source connected to the output node.

11 Claims, 4 Drawing Sheets

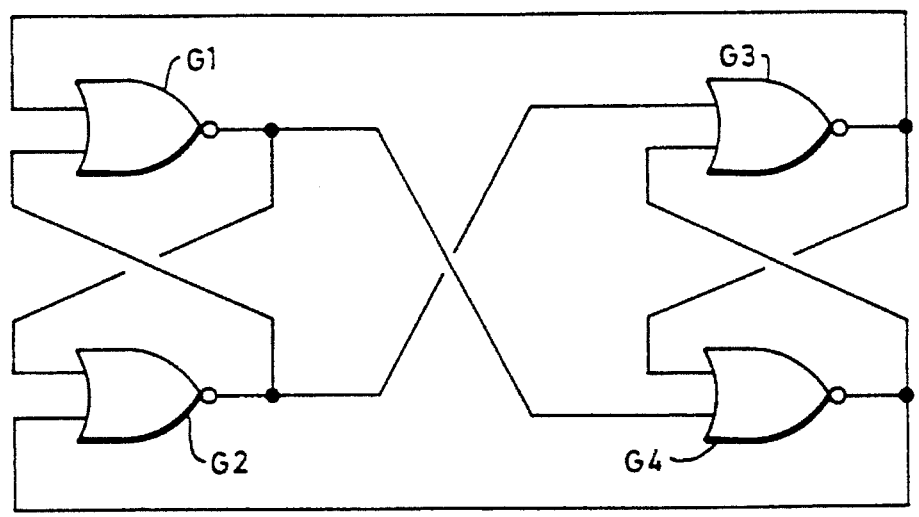
FIG.1
FIG.2
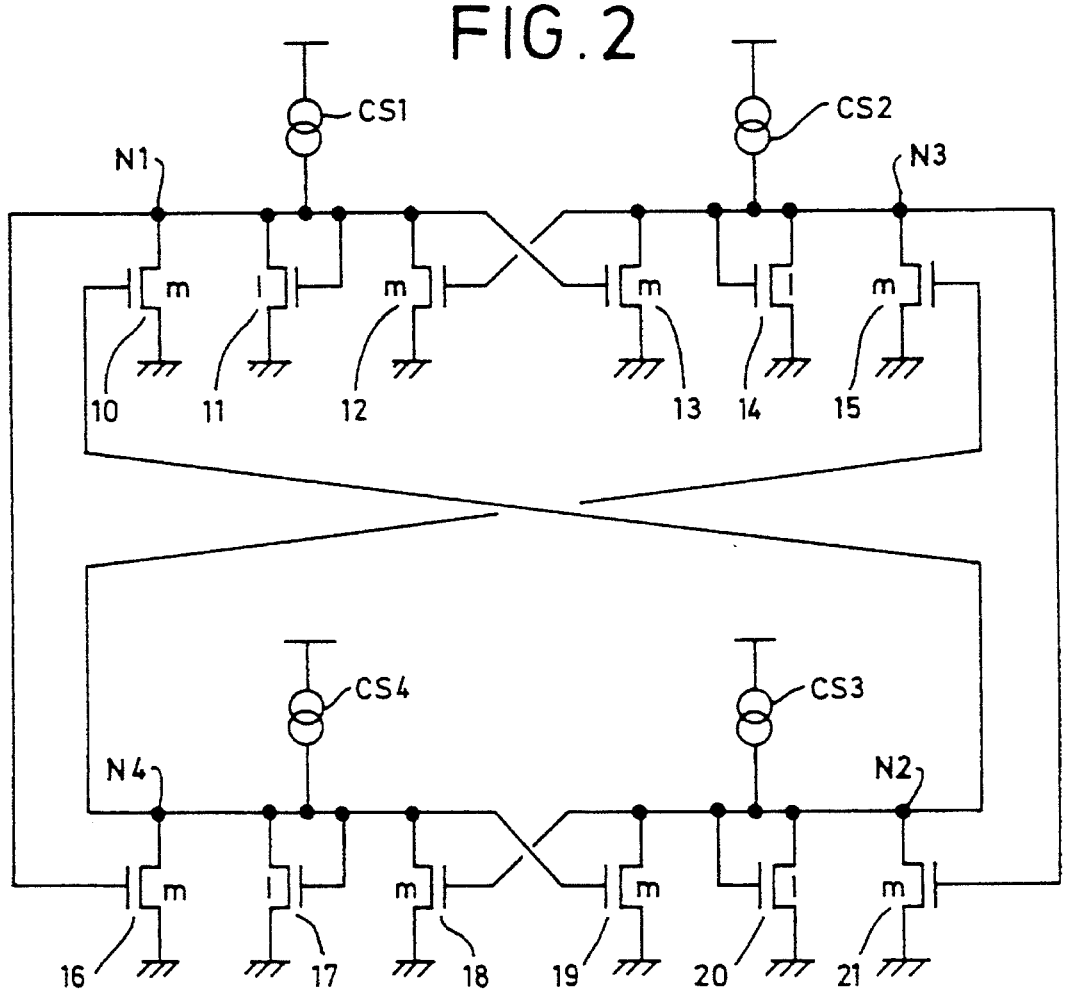

5,602,514

QUADRATURE OSCILLATOR HAVING A VARIABLE FREQUENCY

CROSS-REFERENCE TO RELATED APPLICATION

This application is a continuation of U.S. patent application Ser. No. 08/360,697, filed as PCT/GB94/00892 Apr. 27, 1994 and published as WO94/26027 Nov. 10, 1994, now abandoned.

FIELD OF THE INVENTION

This invention relates to an oscillator, and more particularly to a quadrature oscillator.

SUMMARY OF THE INVENTION

According to the present invention there is provided a quadrature oscillator comprising first and second stages. Each stage comprises first and second NOR gates, wherein the output of the first NOR gate of the first stage is connected as an input to the second NOR gate of each of the first and second stages. The output of the second NOR gate of the first stage is connected as an input to the first NOR gate of each of the first and second stages. The output of the first NOR gate of the second stage is connected as an input to the first NOR gate of the first stage and the second NOR gate of the second stage; and the output of the second NOR gate of the second stage is connected as an input to the second NOR gate of the first stage and the first NOR gate of the second stage.

This oscillator is a non-linear circuit which is inherently unstable and which cycles sequentially through four distinct states at a rate determined by the construction of the NOR gates. Preferably, each NOR gate comprises first and second input transistors each having a control node for receiving an input signal and a controllable path between an output node and a reference voltage, a diode-connected transistor connected between the output node and the reference voltage, and a current source connected to the output node.

The rate through which the circuit cycles sequentially through four distinct states is then determined by the current generated by the current source. For this purpose, the current source can include a control node for receiving a control signal for altering the current generated by the current source.

For a better understanding of the present invention and to show how the same may be carried into effect, reference will now be made by way of example to the accompanying drawings.

BRIEF DESCRIPTION OF THE DRAWINGS

FIG. 1 is a schematic diagram of a quadrature oscillator;

FIG. 2 is a transistor level diagram of the circuit of FIG. 1;

DESCRIPTION OF THE PREFERRED EMBODIMENT

As illustrated in FIG. 1, the quadrature oscillator comprises four NOR gates G1 to G4. They are termed herein as follows:

G1—first NOR gate of the first stage;

G2—second NOR gate of the first stage;

G3—first NOR gate of the second stage;

G4—second NOR gate of the second stage.

The output of NOR gate G1 is connected as an input to NOR gate G4 and to NOR gate G2. The output of NOR gate G2 is connected as an input to NOR gate G1 and to NOR gate G3. The output of NOR gate G3 is connected as an input to NOR gate G4 and to NOR gate G1. The output of NOR gate G4 is connected as an input to NOR gate G3 and to NOR gate G2.

Figure 1A:
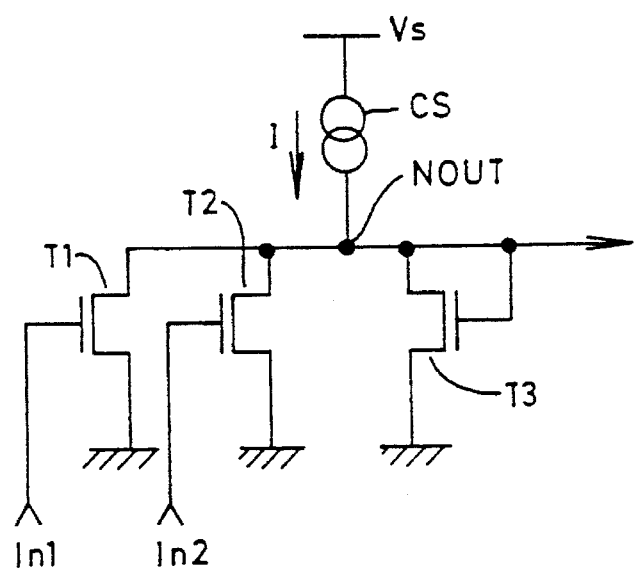
FIG. 1a is a transistor diagram of a NOR gate.

Each NOR gate is implemented as shown in FIG. 1a. That is, each NOR gate has first and second input transistors T1, T2 which are illustrated as n-channel MOS transistors. Input signals In1, In2 are supplied to the gates of these transistors. The drain/source path of the transistors T1, T2 are connected between an output node Nout and a reference voltage Vref (ground in FIG. 1a). A diode connected transistor T3 is also connected between the reference voltage Vref and the output node Nout. Finally, a current source CS is connected between a supply voltage Vs and the output node Nout. The current source generates a current I under the influence of a control signal which is not shown. The current source can be implemented in any suitable fashion and in particular could take the form of a p-channel transistor gated by a control voltage.

FIG. 2 illustrates the circuit of FIG. 1 implemented using NOR gates of the type illustrated in FIG. 1a. The current sources are denoted CS1 to CS4. The first and second input transistors of the NOR gate G1 are designated by reference numerals 10 and 12, the diode connected transistor is designated by reference numeral 11. The first and second input transistors of the NOR gate G2 are designated by reference numerals 13 and 15, the diode connected transistor is designated by reference numeral 14. The first and second input transistors of the NOR gate G3 are designated by reference numerals 19 and 21, the diode connected transistor is designated by reference numeral 20. The first and second input transistors of the NOR gate G4 are designated by reference numerals 16 and 18, the diode connected transistor is designated by reference numeral 17. The value of "m" denotes the ratio between the size of the input transistors in each NOR gate to the diode connected transistor. The value of m is the same in each of the NOR gates. For transistors of a common length, this ratio is the ratio of transistor widths.

Figure 3:
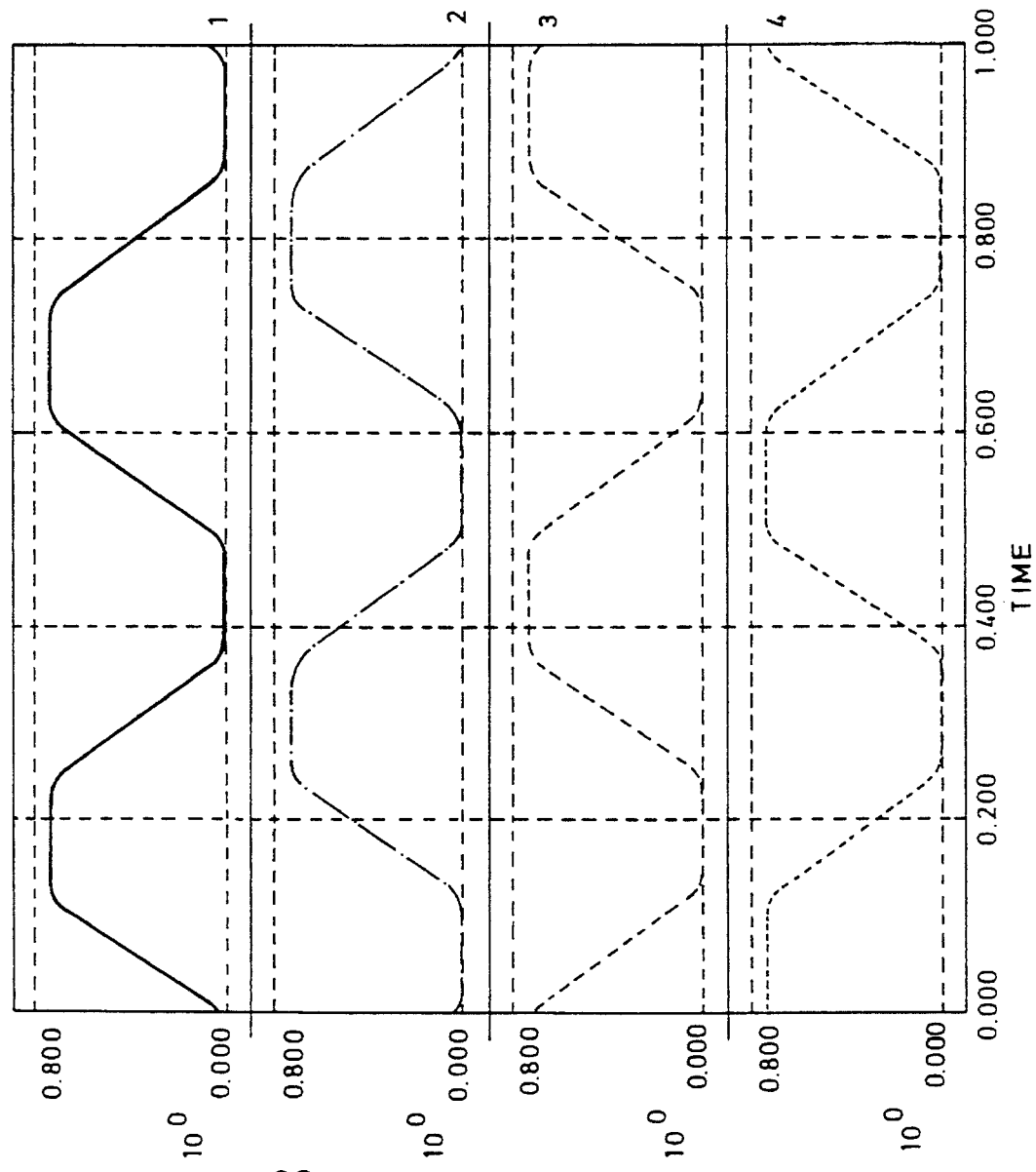
FIG. 3 shows waveforms of signals generated during operation of the oscillator.

Output nodes of NOR gate G1, NOR gate G2, NOR gate G3 and NOR gate G4 are referenced as N1 through N4. FIGS. 3 illustrates waveforms occurring at these nodes.

Operation of the oscillator will now be described with reference to FIG. 2 taking a "0" level at approximately zero volts and a "1" level corresponding to the diode connected transistor in each NOR gate being conductive at just above the threshold voltage Vtn.

1) Assume node 1 is at "0", node 2 at "0", node 3 at "1". Transistors 16 and 18 are off, so node 4 is pulled up by its current-source CS4 until it reaches a "1". Transistor 15 now starts to discharge at node 3, turning off transistor 12. This releases node 1 which starts to rise. Thus we have:

| Node 1 | Node 2 | Node 3 | Node 4 |
|---|---|---|---|
| rising | "0" | falling | "1" |

2) When node 1 reaches a "1", transistor 13 turns on and helps node 3 to reach "0". Transistor 16 is also turned on, so node 4 starts to discharge and transistor 19 turns off. This releases node 2 which now starts to rise. Hence:

| Node 1 | Node 2 | Node 3 | Node 4 |
|---|---|---|---|
| "1" | rising | "0" | falling |

3) When node 2 reaches a "1", transistor 18 turns on and helps node 4 to reach "0". Transistor 10 is also turned on, so node 1 starts to discharge and transistor 13 turns off. This releases node 3 which starts to rise. Hence:

| Node 1 | Node 2 | Node 3 | Node 4 |
|---|---|---|---|
| falling | "1" | rising | "0" |

4) When node 3 reaches a "1", transistor 12 turns on and helps node 1 to reach "0". Transistor 21 is also turned on, so node 2 starts to discharge and transistor 18 turns off. This releases node 4 which starts to rise. Hence:

| Node 1 | Node 2 | Node 3 | Node 4 |
|---|---|---|---|
| "0" | falling | "1" | rising |

5) When node 4 reaches a "1", transistor 19 turns on and helps node 2 to a "0". Transistor 15 is also turned on, so node 3 starts to discharge and transistor 12 turns off. This releases node 1 which starts to rise. Hence:

| Node 1 | Node 2 | Node 3 | Node 4 |
|---|---|---|---|
| rising | "0" | falling | "1" |

This is the same state as at the start of 2) above, so the oscillation continues.

The rising slew rate of an oscillator node is determined by total node capacitance and the current through the current-source. The falling slew rate is determined by total node capacitance, current through the current-source and the parameter "m". If "m"=2, then falling rates are the same as rising rates, and the waveforms look like those in FIG. 3.

Thus, at each of the nodes an oscillating signal is produced. An n-channel transistor driven by the signal at any one of the nodes will only be conducting for 25% of the cycle. For some applications, it is desirable to provide current for 50% of the cycle.

This requirement can be met by using a low-voltage inverting gain stage to buffer the oscillator signal, and ensuring that the speed of the buffer stage is the same as the speed of the oscillator stages.

Figure 4:
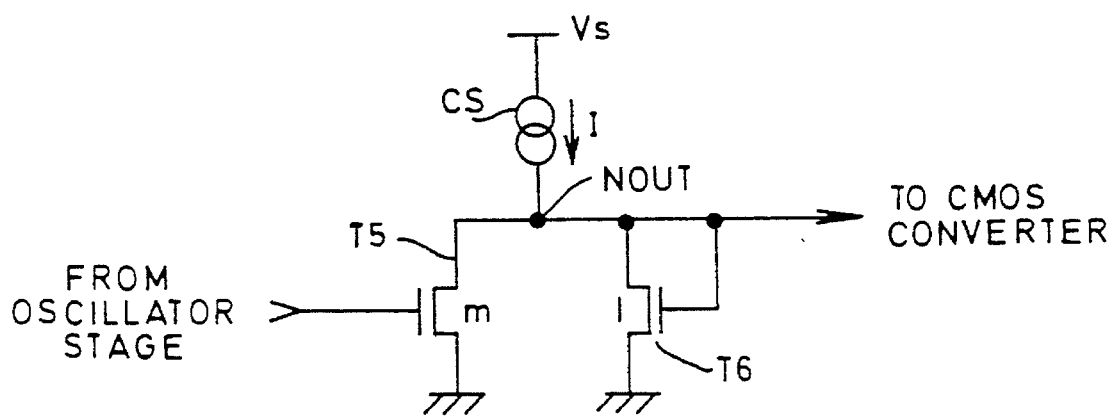
FIG. 4 is a circuit diagram of a buffer circuit.

A simple way to match the speeds is to use a partial oscillator stage operating under the same conditions as the oscillator, i.e. to use the same transistor sizes and currents as in the oscillator stages. It is then only necessary to match the total node capacitance to ensure that the slew rates are identical. FIG. 4 is a transistor diagram of a suitable buffer circuit which comprises an input transistor T5 which receives at its gate a signal from a node of the oscillator stage and whose drain/source path is connected between an output node Nout and a reference voltage Vref (ground in FIG. 4). The buffer circuit also includes a diode connected transistor T6 connected between the output node and the voltage reference Vref and a current source CS generating a current I between a supply voltage Vs and the output node. The output node can be used to drive a CMOS converter such as that described in our copending Application No. PCT/GB94/00891, the contents of which are herein incorporated by reference.

Figure 5:
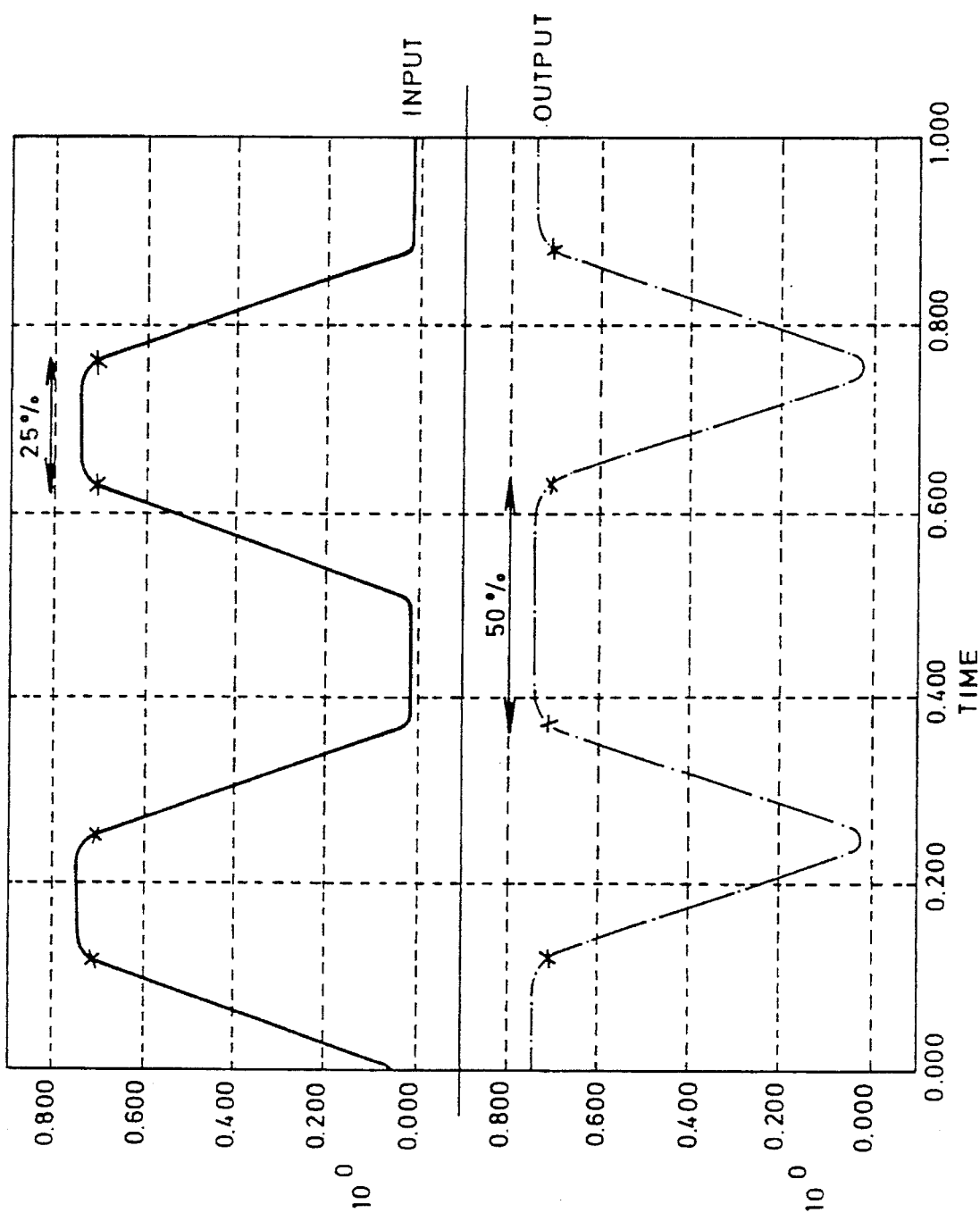
FIG. 5 is a diagram of waveforms illustrating the operation of the buffer circuit.

In FIG. 4, once again "m" denotes the ratio between the transistor sizes of transistor T5 and transistor T6. If m=2, waveforms for the circuit are as shown in FIG. 5. It can be seen that the input waveform is only high (and therefore able to turn on an n-channel transistor) for 25% of the period. However, the output waveform is high for almost 50%, so an n-channel transistor driven by the buffer circuit will conduct for 50% of the cycle.

Use of a buffer stage such as this also effectively isolates the oscillator from disturbances due to noise on a CMOS power supply. Frequency stability is therefore greatly improved.

What is claimed is:

1. A quadrature oscillator comprising:
   first and second stages, each stage comprising first and second NOR gates, wherein:
   the output of the first NOR gate of the first stage is connected as an input to the second NOR gate of each of the first and second stages;
   the output of the second NOR gate of the first stage is connected as an input to the first NOR gate of each of the first and second stages;
   the output of the first NOR gate of the second stage is connected as an input to the first NOR gate of the first stage and the second NOR gate of the second stage;
   the output of the second NOR gate of the second stage is connected as an input to the second NOR gate of the first stage and the first NOR gate of the second stage; and
   each of the NOR gates comprises first and second input transistors that each have a control node for receiving an input signal and a controllable path connected between an output node and a reference voltage, a diode-connected transistor connected between the output node and the reference voltage, and a current source connected to the output node.

2. A quadrature oscillator according to claim 1, wherein the current source is controllable to adjust the rising and falling slew rates of signals generated by the oscillator.

3. A quadrature oscillator according to claim 2, wherein the ratio of size between the first and second input transistor and the diode connected transistor can be selected to adjust the falling slew rate of a signal generated by the oscillator.

4. A quadrature oscillator comprising:
   first and second stages, each stage comprising first and second NOR gates, wherein:
   the output of the first NOR gate of the first stage is connected as an input to the second NOR gate of each of the first and second stages;

the output of the second NOR gate of the first stage is connected as an input to the first NOR gate of each of the first and second stages;

the output of the first NOR gate of the second stage is connected as an input to the first NOR gate of the first stage and the second NOR gate of the second stage;

the output of the second NOR gate of the second stage is connected as an input to the second NOR gate of the first stage and the first NOR gate of the second stage; and a buffer circuit connected to receive a signal generated by the oscillator which is high over 25% of a cycle and to supply a buffered signal which is high over 50% of a cycle.

5. A quadrature oscillator according to claim 4, wherein the buffer circuit comprises a partial oscillator stage operating under the same conditions as a stage of the oscillator thereby ensuring that the buffer delay matches the oscillator stage delay.

6. A quadrature oscillator, which cycles sequentially through four distinct states, said oscillator comprising:

a first stage including:
 a first NOR gate having a first input terminal, a second input terminal, and an output terminal; and
 a second NOR gate having a first input terminal coupled to the output terminal of the first NOR gate, a second input terminal, and an output terminal coupled to the second input terminal of the first NOR gate;

a second stage including:
 a third NOR gate having a first input terminal coupled to the output terminal of the second NOR gate, a second input terminal, and an output terminal coupled to the first input terminal of the first NOR gate;
 a fourth NOR gate having a first input terminal coupled to the output terminal of the third NOR gate, a second input terminal coupled to the output terminal of the first NOR gate, and an output terminal coupled to the second input terminal of the third NOR gate; and wherein said first, second, third, and fourth NOR gates each include:
 a reference terminal;
 a first transistor having a control node connected to the first input terminal, and having a controllable path connected between the output terminal and the reference terminal;
 a second transistor having a control node connected to the second input terminal, and having a controllable path connected between the output terminal and the reference terminal;
 a diode-connected transistor connected between the output terminal and the reference terminal; and
 a current source connected to the output terminal.

7. The quadrature oscillator of claim 6 wherein the current sources of each of said NOR gates are controllable to adjust rising and falling slew rates of signals that the oscillator generates.

8. The quadrature oscillator of claim 7 wherein a ratio of size between the first and second input transistors and the diode-connected transistor of each of said NOR gates is selectable to adjust the falling slew rate of the signals that the oscillator generates.

9. The quadrature oscillator of claim 6 further comprising:
 a ratio between a size of said first and second transistors and a size of said diode-connected transistor, said ratio having a first predetermined value;
 said current source operable to generate a current having a second predetermined value; and
 a buffer circuit having an output terminal, a reference terminal, and an input terminal connected to said output terminal of one of said NOR gates, said buffer circuit including:
  a first transistor having a control node connected to said input terminal of said buffer circuit, and having a controllable path connected between said output and reference terminals of said buffer circuit;
  a diode-connected transistor connected between said output and reference terminals of said buffer circuit;
  a current source coupled to said output terminal of said buffer circuit and operable to generate a current having said second predetermined value; and
 wherein a ratio between a size of said first transistor and said diode-connected transistor of said buffer circuit has said first predetermined value.

10. A quadrature oscillator, which cycles sequentially through four distinct states, said oscillator comprising:

a first stage including:
 a first NOR gate having a first input terminal, a second input terminal, and an output terminal; and
 a second NOR gate having a first input terminal coupled to the output terminal of the first NOR gate, a second input terminal, and an output terminal coupled to the second input terminal of the first NOR gate;

a second stage including:
 a third NOR gate having a first input terminal coupled to the output terminal of the second NOR gate, a second input terminal and an output terminal coupled to the first input terminal of the first NOR gate;
 a fourth NOR gate having a first input terminal coupled to the output terminal of the third NOR gate, a second input terminal coupled to the output terminal of the first NOR gate, and an output terminal coupled to the second input terminal of the third NOR gate; and a buffer circuit having an input terminal coupled to one of the output terminals and operable to generate at a buffer output terminal a signal that is at a logic high level for at least half of a cycle.

11. The quadrature oscillator of claim 10 wherein the buffer circuit comprises a partial operator stage that operates under substantially the same conditions as the NOR gates to ensure that a delay of the buffer matches a delay of each of the NOR gates.

* * * * *